United States Patent
Tang et al.

(10) Patent No.: US 9,966,528 B2
(45) Date of Patent: May 8, 2018

(54) METHOD AND SYSTEM FOR PROVIDING A MAGNETIC LAYER IN A MAGNETIC JUNCTION USABLE IN SPIN TRANSFER TORQUE APPLICATIONS USING A SACRIFICIAL OXIDE LAYER

(71) Applicant: Samsung Electronics Co., LTD., Gyeonggi-do (KR)

(72) Inventors: Xueti Tang, Fremont, CA (US); Mohamad Towfik Krounbi, San Jose, CA (US); Gen Feng, North Potomac, MD (US); Vladimir Nikitin, Campbell, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/177,176

(22) Filed: Jun. 8, 2016

(65) Prior Publication Data
US 2017/0256702 A1    Sep. 7, 2017

Related U.S. Application Data

(60) Provisional application No. 62/304,925, filed on Mar. 7, 2016.

(51) Int. Cl.
*H01L 43/10* (2006.01)
*H01L 43/02* (2006.01)
(Continued)

(52) U.S. Cl.
CPC .......... *H01L 43/02* (2013.01); *G11C 11/1673* (2013.01); *G11C 11/1675* (2013.01);
(Continued)

(58) Field of Classification Search
CPC ....... H01L 43/12; H01L 41/25; H01L 27/222; H01L 43/08; H01L 43/10; H01L 45/06;
(Continued)

(56) References Cited

U.S. PATENT DOCUMENTS 9,263,668 B2 *    2/2016   Choi .................. H01L 43/10

\* cited by examiner

*Primary Examiner* — Marc Armand
*Assistant Examiner* — Quinton Brasfield
(74) *Attorney, Agent, or Firm* — Convergent Law Group LLP

(57) ABSTRACT

A magnetic junction and method for providing the magnetic junction are described. The magnetic junction includes free and pinned layers separated by a nonmagnetic spacer layer. The free layer is switchable between stable magnetic states when a write current is passed through the magnetic junction. Providing the pinned and/or free layer(s) includes providing a magnetic layer including a glass-promoting component, providing a sacrificial oxide layer on the magnetic layer, providing a sacrificial layer on the sacrificial oxide layer and performing at least one anneal of the magnetic layer, the sacrificial oxide layer and the sacrificial layer at anneal temperature(s) greater than 300 degrees Celsius and not exceeding 475 degrees Celsius. The magnetic layer is amorphous as-deposited but is at least partially crystallized after the anneal(s). The sacrificial layer includes a sink for the glass-promoting component. The sacrificial layer and the sacrificial oxide layer are removed after the anneal(s).

19 Claims, 9 Drawing Sheets

(51) Int. Cl.
*G11C 11/16* (2006.01)
*H01L 43/08* (2006.01)
*H01L 43/12* (2006.01)

(52) U.S. Cl.
CPC .............. *H01L 43/08* (2013.01); *H01L 43/10* (2013.01); *H01L 43/12* (2013.01)

(58) Field of Classification Search
CPC ... H01L 45/1233; G11C 11/161; G11C 11/15; G11C 11/16; G11C 17/02
See application file for complete search history.

METHOD AND SYSTEM FOR PROVIDING A MAGNETIC LAYER IN A MAGNETIC JUNCTION USABLE IN SPIN TRANSFER TORQUE APPLICATIONS USING A SACRIFICIAL OXIDE LAYER

CROSS-REFERENCE TO RELATED APPLICATIONS

This application claims the benefit of provisional Patent Application Ser. No. 62/304,925, filed Mar. 7, 2016, entitled MgO INSERTION AND PLASMA TREATMENT, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional pinned layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional pinned layer and the conventional free layer are magnetic. The magnetization of the conventional pinned layer is fixed, or pinned, in a particular direction. The conventional free layer has a changeable magnetization. The conventional free layer may be a single layer or include multiple layers. The pinned layer and free layer may have their magnetizations oriented perpendicular to the plane of the layers (perpendicular-to-plane) or in the plane of the layers (in-plane).

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-MRAM are desired. For example, current magnetic junctions may use various materials to provide the desired properties, such as a high perpendicular magnetic anisotropy and a high magnetoresistance. However, fabricating a magnetic junction having the desired characteristics using these materials may be challenging. Accordingly, what is needed is a method and system that may improve the performance of the spin transfer torque based memories. The method and system described herein address such a need.

BRIEF SUMMARY OF THE INVENTION

A magnetic junction and method for providing the magnetic junction are described. The magnetic junction includes free and pinned layers separated by a nonmagnetic spacer layer. The free layer is switchable between stable magnetic states when a write current is passed through the magnetic junction. Providing the pinned and/or free layer(s) includes providing a magnetic layer including a glass-promoting component, providing a sacrificial oxide layer on the magnetic layer, providing a sacrificial layer on the sacrificial oxide layer and performing at least one anneal of the magnetic layer, the sacrificial oxide layer and the sacrificial layer at anneal temperature(s) greater than 300 degrees Celsius and not exceeding 475 degrees Celsius. The magnetic layer is amorphous as-deposited but is at least partially crystallized after the anneal(s). The sacrificial layer includes a sink for the glass-promoting component. The sacrificial layer and the sacrificial oxide layer are removed after the anneal(s).

DETAILED DESCRIPTION OF THE INVENTION

Figure 1:
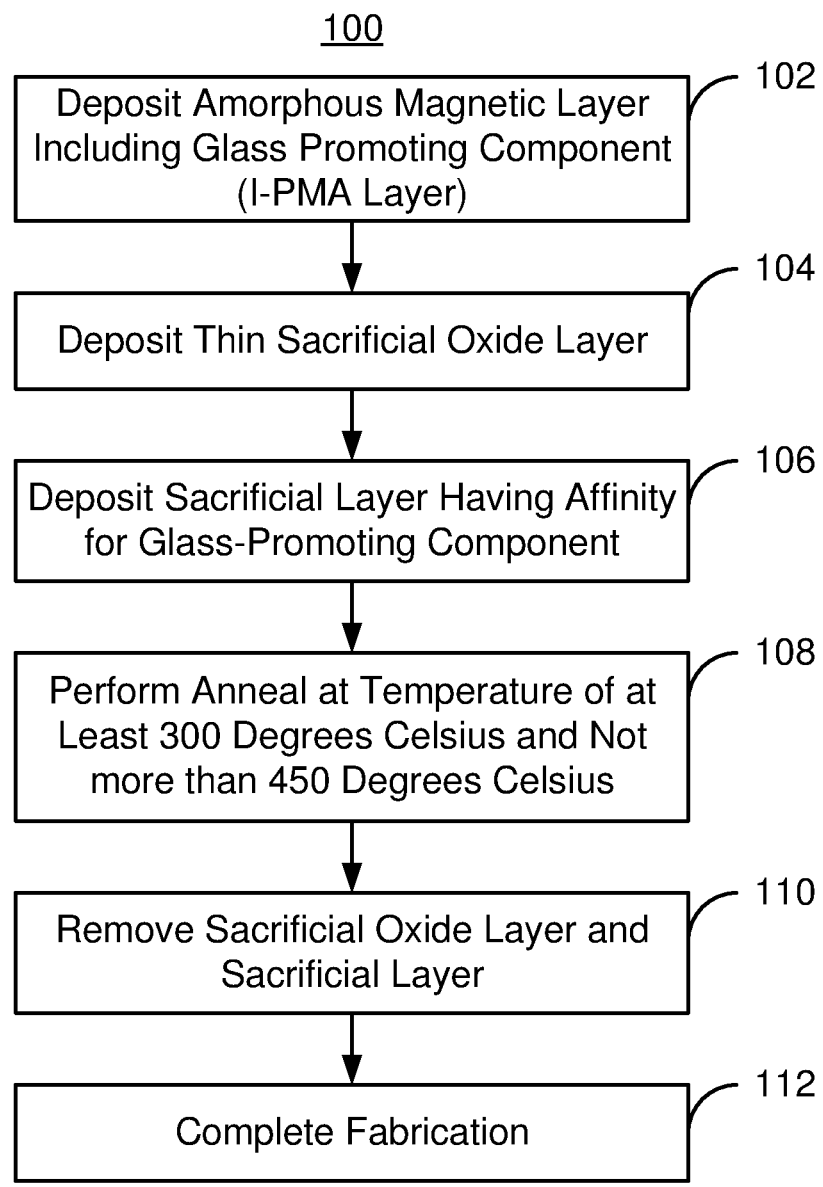
FIG. 1 is a flow chart depicting an exemplary embodiment of a method that utilizes sacrificial oxide and sacrificial layers for providing a layer for magnetic junction usable in a magnetic devices such as a magnetic memory programmable using spin transfer torque.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction and method for providing the magnetic junction are described. The magnetic junction includes free and pinned layers separated by a nonmagnetic spacer layer. The free layer is switchable between stable magnetic states when a write current is passed through the magnetic junction. Providing the pinned and/or free layer(s) includes providing a magnetic layer including a glass-promoting component, providing a sacrificial oxide layer on the magnetic layer, providing a sacrificial layer on the sacrificial oxide layer and performing at least one anneal of the magnetic layer, the sacrificial oxide layer and the sacrificial layer at anneal temperature(s) greater than 300 degrees Celsius and not exceeding 475 degrees Celsius. The magnetic layer is amorphous as-deposited but is at least partially crystallized after the anneal(s). The sacrificial layer includes a sink for the glass-promoting component. The sacrificial layer and the sacrificial oxide layer are removed after the anneal(s).

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

FIG. 1 is a flow chart depicting an exemplary embodiment of a method 100 that utilizes sacrificial oxide and sacrificial layers for providing a layer for magnetic junction usable in a magnetic device such as a spin transfer torque magnetic random access memory (STT-MRAM) and, therefore, in a variety of electronic devices. The magnetic layers of the magnetic junction may have a high perpendicular magnetic anisotropy (PMA). Stated differently, the perpendicular magnetic anisotropy energy may exceed the out-of-plane demagnetization energy. Such a configuration allows for the magnetic moment of a high PMA layer to be stable perpendicular to plane. For simplicity, some steps may be omitted, performed in another order, include substeps and/or combined. Further, the method 100 may start after other steps in forming a magnetic memory have been performed. FIGS. 2-6 depict an exemplary embodiment of a magnetic layer 200 for a magnetic junction that may be fabricated using the method 100. FIGS. 2-6 are not to scale. Referring to FIGS. 1-6, the method 100 is described in the context of the layer 200 for the magnetic junction. However, analogous layer for other magnetic junctions may be formed. Further, multiple layers for multiple magnetic junctions may be simultaneously fabricated.

A magnetic layer including at least one glass-promoting component is deposited, via step 102. Because of the presence of the glass-promoting component, the magnetic layer is amorphous as-deposited. A single glass-promoting component in the magnetic layer is described herein. However, multiple glass-promoting components may be used in other embodiments. For example, a layer containing CoFeB and/or FeB may be deposited. In such an embodiment, B is the glass-promoting component. The CoFeB layer may be a $(CoFe)_{1-x}B_x$ layer, where x is at least 0.2 and not more than 0.5. For example, x may be nominally 0.4. In general, alloys mentioned herein do not indicate specific stoichiometries unless specifically mentioned. For example, the term CoFeB indicates an alloy of Co, Fe and B. The term CoFeB is intended to indicate an alloy having at least twenty percent and not more than fifty atomic percent B alloyed with CoFe, as discussed above. The term CoFeB is not intended to be restricted to an alloy having equal amounts of Co, Fe and B. The CoFeB layer and/or FeB layer provided in step 102 is amorphous as deposited. As discussed above, B is the glass-promoting component in such a layer. Other magnetic layers and/or other glass-promoting components may be used.

Figure 2:
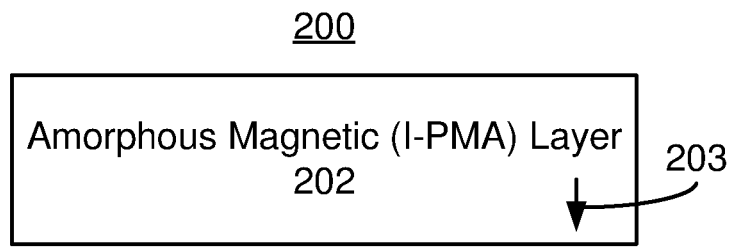
FIGS. 2-6 depict an exemplary embodiment of a layer in a magnetic junction usable in a magnetic devices such as a magnetic memory programmable using spin transfer torque during fabrication.

The magnetic layer including the glass-promoting component may also have a high PMA. Stated differently, the perpendicular magnetic anisotropy energy is greater than the out-of-plane demagnetization energy. The magnetic layer may be considered have an interfacial perpendicular magnetic anisotropy (I-PMA). Such an I-PMA layer includes material(s) and a structure which has a high perpendicular magnetic anisotropy due to effects near the interfaces of the structure with other layers (i.e. the interface of the structure). Such a magnetic layer may have its magnetic moment stable perpendicular-to-plane. The material(s) usable in the I-PMA include but are not limited to the CoFeB and the FeB discussed above. In addition, the magnetic layer having an I-PMA and provided in step 102 may include one or more of CoB, Fe, $Co_2FeAl$, $Co_2FeAlSi$, $Co_2MnSi$ and MnAl. FIG. 2 depicts the magnetic layer 200 after step 102 is performed. Thus, the amorphous magnetic layer 202 is shown. As discussed above, the amorphous magnetic layer 202 includes a glass-promoting component that allows the high I-PMA layer to be amorphous as-deposited. In addition, the magnetic moment 203 is perpendicular-to-plane.

Figure 3:
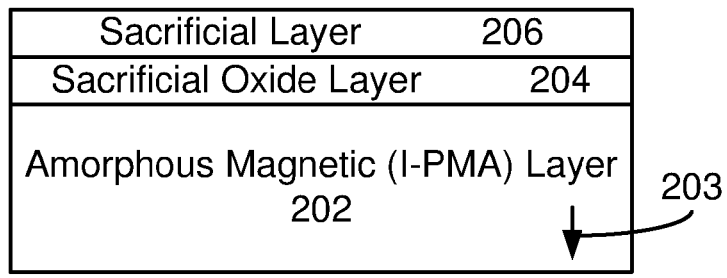

A sacrificial oxide layer and a sacrificial layer are deposited in steps 104 and 106, respectively. FIG. 3 depicts the layer 200 after step 106 is performed. Thus, the sacrificial oxide layer 204 and sacrificial layer 206 are shown. The sacrificial oxide layer 204 may be an MgO layer. The sacrificial oxide layer 204 is desired to be thin. The sacrificial oxide layer 204 may be not more than five Angstroms thick and greater than zero Angstroms thick. For example, the sacrificial oxide layer 204 may be nominally three through four Angstroms thick.

The sacrificial layer 206 is a sink for the glass-promoting component. Stated differently, the sacrificial layer 206 has a high affinity for the glass-promoting component. The sacrificial layer 206 may include one or more of Ta, Hf, Rb, Sc, Zr, Nb, Mg, V, Mn, Ag, Be, Mo, Ti, Cr, Al, Te and W. In some embodiments, the sacrificial layer 206 includes at least one of W, Ta and Mo, which have a high affinity for B. The sacrificial layer 206 is also desired to be thin. For example, in some embodiments, the sacrificial layer 206 may be at least two Angstroms thick and not more than five Angstroms thick. For example, the sacrificial layer 206 may be nominally three through four Angstroms thick. The sacrificial oxide layer 204 is sufficiently thin that the glass-promoting component may migrate through the layer 204 to the layer 206 during an anneal, discussed below.

Once the sacrificial oxide layer 204 and the sacrificial layer 206 are present, an anneal is performed, via step 108. The anneal is at an anneal temperature greater than two hundred degrees Celsius. In some embodiments, the anneal temperature is at least three hundred degrees Celsius and not more than four hundred seventy-five degrees Celsius. In some such embodiments, the anneal is at a temperature of at least three hundred fifty degrees Celsius and not more than four hundred fifty degrees. For example, in some embodiments, the anneal temperature is nominally three hundred fifty degrees Celsius. In other embodiments, the anneal temperature is nominally four hundred fifty degrees Celsius. In other embodiments, other temperatures and times may be used. The anneal carried out in step 108 may be a rapid thermal anneal (RTA) having a duration on the order of twenty minutes or less. In some embodiments, the RTA is performed for not more than ten minutes. Because of the anneal, the amorphous magnetic layer 202 is at least partially crystallized.

Figure 4:
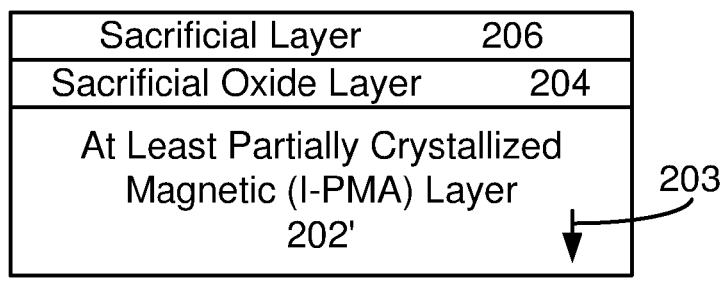

FIG. 4 depicts the layer 200 after step 108 is performed. Consequently, the layer 202' is at least partially crystallized. Stated differently, the anneal performed in step 108 aids in allowing the desired crystal structure to be formed by the magnetic layer 202'. Because of the presence of the sacrificial layer 206 and the low thickness of the sacrificial oxide layer 204, the glass-promoting component (such as B) in the magnetic layer 202' may tend to migrate to the sacrificial layer 206. Consequently, the stoichiometry of the magnetic layer 202' may change during the anneal performed in step 108. In some embodiments, the magnetic layer 202' becomes poorer in the diffusing constituent. For example, a CoFeB layer or FeB used for the magnetic layer 202' may become B poor. In some embodiments, a crystalline CoFe layer remains. However, such a layer is still referred to as a CoFeB layer. After partial crystallization, the crystallized portion of the magnetic layer 202' has the desired crystal structure and orientation. For example, the CoFeB or FeB layer may have a body-centered cubic crystal structure and a (100) orientation.

Figure 5:
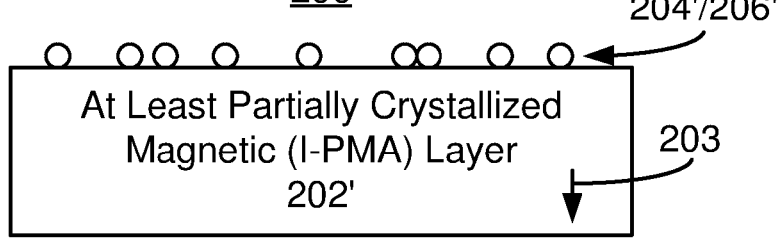

The sacrificial layer 206 and sacrificial oxide layer 204 are removed, via step 110. In some embodiments, this is accomplished by plasma etching the layer 200. Thus, nonreactive ions, such as Ar ions, may be used to bombard the surface of the layer 200. In some embodiments, a portion of the magnetic layer 202' is also removed. FIG. 5 depicts the magnetic layer 200 after step 110 is performed. The layers 204 and 206 have been removed. However, some residue 204'/206' from one or both of these layers may remain in the embodiment shown in FIG. 5. For example, the residue 204'/206' may include MgO, W and/or Ta. In other embodiments, no residue 204'/206' remains after step 110. If the etch is carried out to remove a portion of the magnetic layer 202, then the magnetic layer 202' may be thinner than as-deposited.

Figure 6:
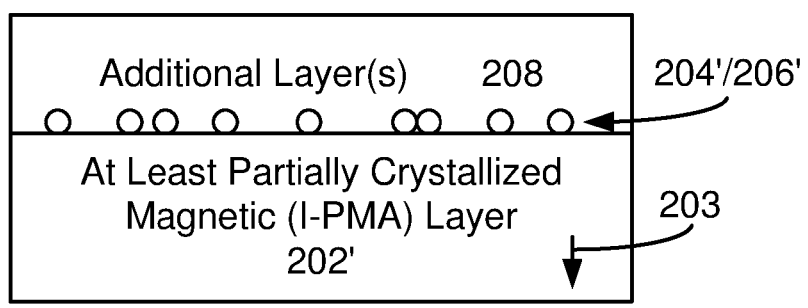

Fabrication of the layer 200 may then be completed, via step 112. In some embodiments, step 112 includes depositing one or more additional layers. For example, an additional I-PMA layer, such as CoFeB, may be deposited. Alternatively, other high PMA layer(s) may be formed. For example, a bulk perpendicular magnetic anisotropy (B-PMA) layer may be formed. The B-PMA layer includes material(s) and a structure which has a high perpendicular magnetic anisotropy due to effects throughout the structure (i.e. the bulk of the structure). Thus, the B-PMA layer may be made thick while maintaining a high PMA (perpendicular magnetic anisotropy energy exceeding out-of-plane demagnetization energy). The B-PMA layer may be a multilayer including multiple repeats of a Co/Pt bilayer (otherwise denoted or $(Co/Pt)_n$), a CoPt alloy, a CoTb alloy and/or multiple repeats of a Co/Tb bilayer. Other possibilities for the B-PMA layer include, but are not limited to multiple repeats of a CoTb/FeB bilayer, a FePd alloy, a FePdB alloy, a CoPd alloy, a FePt alloy, a TbCoFe alloy, a GaMn alloy, a GeMn alloy, multiple repeats of a Co/Pd bilayer, multiple repeats of a Fe/Pt bilayer, multiple repeats of a Co/Ni bilayer, multiple repeats of a Tb/CoFe bilayer, multiple repeats of a Co/Ir bilayer, and/or multiple repeats of a Co/TbCoFe bilayer. For example, a Co layer, a Pt layer and a Co/Pt multilayer may be formed in step 112. Alternatively, no other portion of the layer 200 resides on the layer 202'. In some cases, however, the layer 202' is formed on additional sublayers of the layer 200. FIG. 6 depicts the magnetic layer 200 after step 112 is performed. Thus, additional layer(s) 208 are shown. In other embodiments, step 112 may be omitted or the magnetic layer 202' resides on the additional layer(s) 208.

Thus, the magnetic layer 200 may be formed using the method 100. The layer 200 may be used in the free layer, the pinned layer, or both the free layer and the pinned layer of a magnetic junction. Use of the sacrificial layer 206 and may improve the crystallinity of the layer 202'. For example, the magnetic layer 202' may have a body-centered cubic structure and a (100) orientation. In addition, coupling between the magnetic layer 202' and the additional layer(s) 208 may be improved. Because the additional layer(s) 208 may include high PMA layers, this enhanced coupling may improve the PMA and stability of the magnetic layer 200. As a result, the perpendicular magnetic anisotropy energy of the layer 202' and the layer 200 may exceed the out-of-plane demagnetization energy. The magnetic moment 203 may thus be stable perpendicular-to-plane. Magnetoresistance, such as tunneling magnetoresistance (TMR) of a magnetic junction using the layer 200/202' may also be enhanced. Use of the sacrificial oxide layer 204 may facilitate the removal of the layers 204 and 206 using a plasma etch while reducing damage to the underlying magnetic layer 202'. This may be because the sacrificial oxide layer may include materials that are more easily plasma etched than the material(s) for the sacrificial layer. This reduction in damage improve the uniformity of the layer 202' across a single substrate. Variations in the layer 202' from substrate to substrate may also be reduced by the use of the sacrificial oxide layer 204. Consequently, the improvements achieved through the use of the sacrificial layer 206 may be made more repeatable and uniform. Thus, performance the magnetic junction formed with the layer 200 fabricated using the method 100 may be improved.

Figure 7:
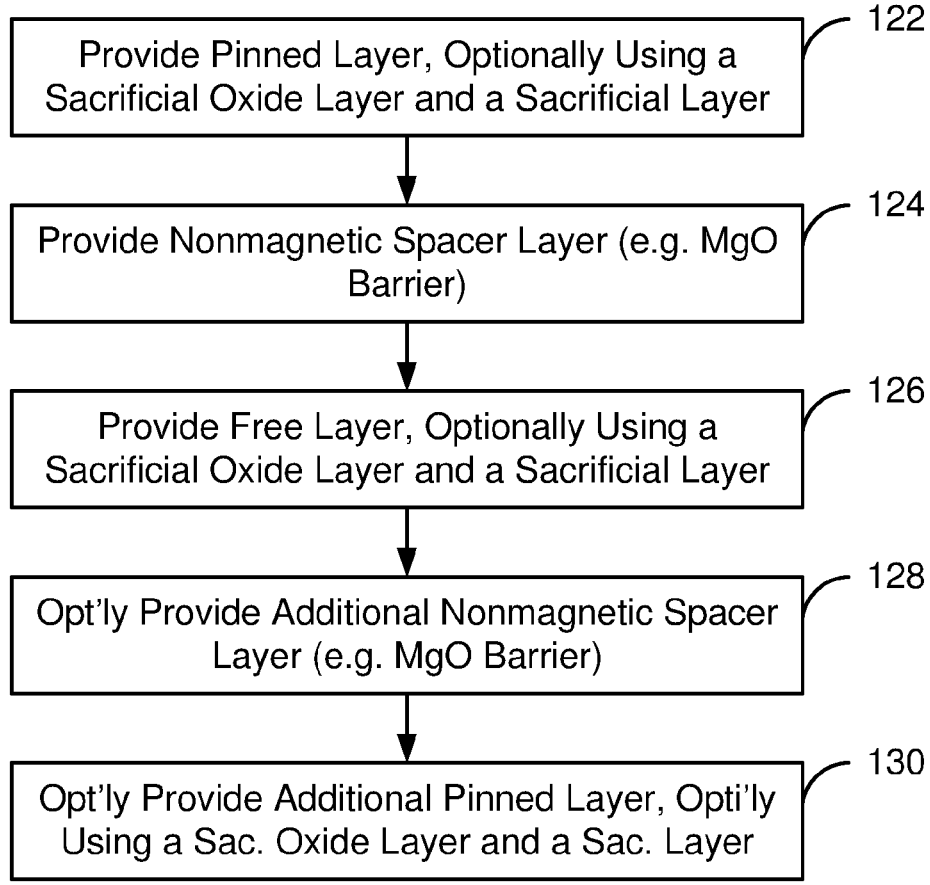
FIG. 7 is a flow chart depicting an exemplary embodiment of a method that utilizes an insertion layer for providing a magnetic junction usable in a magnetic devices such as a magnetic memory programmable using spin transfer torque and having magnetic layer(s) fabricated using sacrificial oxide and sacrificial layers.

FIG. 7 is a flow chart depicting an exemplary embodiment of a method 120 that utilizes sacrificial oxide and sacrificial layers for providing a layer for magnetic junction usable in a magnetic device such as a STT-MRAM and, therefore, in a variety of electronic devices. For simplicity, some steps may be omitted, performed in another order, include substeps and/or combined. Further, the method 120 may start after other steps in forming a magnetic memory have been performed. Further, multiple magnetic junctions may be simultaneously fabricated.

A pinned layer may be provided, via step 122. Step 122 is performed for a bottom pinned magnetic junction (pinned layer formed before the free layer) and for a dual magnetic junction. The pinned layer is magnetic and may have its magnetization pinned, or fixed, in a particular direction during at least a portion of the operation of the magnetic junction. The pinned layer may thus be thermally stable at operating temperatures. The pinned layer formed in step 122 may be a simple (single) layer or may include multiple layers. For example, the pinned layer formed in step 122 may be a synthetic antiferromagnet (SAF) including magnetic layers antiferromagnetically or ferromagnetically coupled through thin nonmagnetic layer(s), such as Ru. In such a SAF, each magnetic layer may also include multiple layers. The pinned layer may also be another multilayer. The pinned layer formed in step 122 may have a perpendicular anisotropy energy that exceeds the out-of-plane demagnetization energy. Thus, the pinned layer may have its magnetic moment oriented perpendicular to plane. Other orientations of the magnetization of the pinned layer are possible. In some embodiments, step 122 is performed using the method 100. Thus, the pinned layer may be formed by depositing a magnetic layer having a glass-promoting component, depositing a sacrificial oxide layer, depositing a sacrificial layer, annealing the layers, removing the sacrificial oxide and sacrificial layers and completing fabrication of the layer.

A nonmagnetic spacer layer may be provided, via step 124. Step 124 is performed for a bottom pinned magnetic junction and a dual magnetic junction. In some embodiments, a crystalline MgO tunneling barrier layer may be desired for the magnetic junction being formed. In some embodiments, step 124 may include depositing MgO using, for example, radio frequency (RF) sputtering. In other embodiments, metallic Mg may be deposited and then oxidized in step 124 to provide a natural oxide of Mg. The MgO barrier layer/nonmagnetic spacer layer may also be formed in another manner. Step 124 may include annealing the portion of the magnetic junction already formed to provide crystalline MgO tunneling barrier with a (100) orientation for enhanced TMR of the magnetic junction.

A free layer is provided, via step 126. Step 126 includes depositing the material(s) for the free layer. In some embodiments, step 126 is performed using the method 100. Thus, the free layer may be formed by depositing a magnetic layer having a glass-promoting component, depositing a sacrificial oxide layer, depositing a sacrificial layer, annealing the layers, removing the sacrificial oxide and sacrificial layers and completing fabrication of the layer. If steps 122 and 124 are omitted, then the free layer may be deposited on seed layer(s). In such embodiments, a top pinned magnetic junction is fabricated. The seed layer(s) may be selected for various purposes including but not limited to the desired crystal structure of the free layer, magnetic anisotropy and/or magnetic damping of the free layer. For example, the free layer may be provided on a seed layer such as a crystalline MgO layer that promotes a perpendicular magnetic anisotropy in the free layer. If a dual magnetic junction or bottom pinned magnetic junction is fabricated, the free layer may be formed on a nonmagnetic spacer layer provided in step 124.

A nonmagnetic spacer layer may be provided, via step 128. Step 128 is performed if a dual magnetic junction or top pinned magnetic junction is desired to be fabricated. If a single, bottom pinned magnetic junction is desired, then step 128 is omitted. In some embodiments, an additional crystalline MgO tunneling barrier layer may be desired for the magnetic junction being formed. Step 128 may thus be performed as described above with respect to step 124.

An additional pinned layer may optionally be provided, via step 130. Step 130 may be performed if a dual magnetic junction or top pinned magnetic junction is desired to be fabricated. If a single, bottom pinned magnetic junction is desired, then step 130 is omitted. In some embodiments, step 130 is performed using the method 100. Thus, the pinned layer may be formed by depositing a magnetic layer having a glass-promoting component, depositing a sacrificial oxide layer, depositing a sacrificial layer, annealing the layers, removing the sacrificial oxide and sacrificial layers and completing fabrication of the layer. Thus, the perpendicular magnetic anisotropy energy may exceed the out-of-plane demagnetization energy for the pinned layer formed in step 130.

Fabrication of the magnetic junction may then be completed. For example, the capping layer(s) may be deposited and the edges of the magnetic junction defined, for example by providing a mask on the layers that have been deposited and ion milling the exposed portions of the layers. In some embodiments, an ion mill may be performed. Thus, the edges of the magnetic junction may be defined after steps 122 through 130 are performed. Alternatively, the edges of various layers may be formed at other times. Additional structures, such as contacts and conductive lines may also be formed for the device in which the magnetic junction is used.

Figure 8:
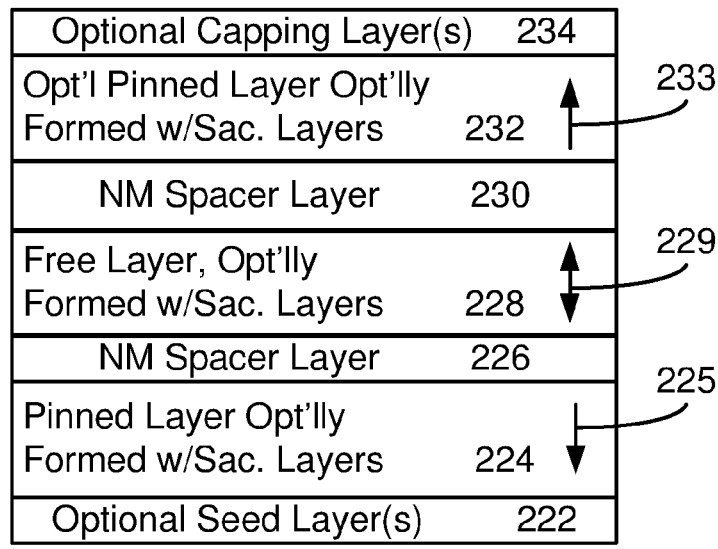
FIG. 8 depicts an exemplary embodiment of a magnetic junction usable in a magnetic devices such as a magnetic memory programmable using spin transfer torque and having magnetic layer(s) fabricated using sacrificial oxide and sacrificial layers.

FIG. 8 depicts an exemplary embodiment of a magnetic junction 220 that may be fabricated using the method 120. For clarity, FIG. 8 is not to scale. The magnetic junction 220 may be used in a magnetic device such as a STT-MRAM and, therefore, in a variety of electronic devices. The magnetic junction 220 includes optional seed layer(s) 222, a pinned layer 224 having a magnetic moment 225, a nonmagnetic spacer layer 226, a free layer 228 having magnetic moment 229, an optional additional nonmagnetic spacer layer 230, and an optional additional pinned layer 232 having magnetic moment 233. Also shown are capping layer(s) 234. A bottom contact and a top contact are not shown but may be formed. Similarly, polarization enhancement and other layers may be present but are not shown for simplicity. As can be seen in FIG. 8, the magnetic junction 220 is a dual magnetic junction. In another embodiment, the additional nonmagnetic spacer layer 230 and additional pinned layer 232 might be omitted. In such an embodiment, the magnetic junction 220 is a bottom pinned magnetic junction. Alternatively, the pinned layer 224 and nonmagnetic spacer layer 226 might be omitted. In such an embodiment, the magnetic junction 220 is a top pinned magnetic junction. Optional pinning layer(s) (not shown) may be used to fix the magnetization of the pinned layer(s) 224 and/or 232. In some embodiments, the optional pinning layer may be an AFM layer or multilayer that pins the magnetization(s) through an exchange-bias interaction. However, in other embodiments, the optional pinning layer may be omitted or another structure may be used.

In the embodiment shown in FIG. 8, one or more of the magnetic layers 224, 228 and 232 are formed using the method 100. Thus, the pinned layers 224 and 232 and the free layer 232 may have their magnetic moments 225, 229 and 233 stable perpendicular-to-plane, as shown. The magnetic junction 220 is also configured to allow the free layer 228 to be switched between stable magnetic states when a write current is passed through the magnetic junction 220. Thus, the free layer 228 is switchable utilizing spin transfer torque when a write current is driven through the magnetic junction 220 in a current perpendicular-to-plane (CPP) direction. The data stored in the magnetic junction 220, and thus the direction of magnetization of the free layer 228, may be read by driving a read current through the magnetic junction 220. The read current may also be driven through the magnetic junction 220 in the CPP direction. Thus, the magnetoresistance of the magnetic junction 220 provides the read signal.

The magnetic junction 220 may have improved performance due to fabrication using the method 100 in the step(s) 122, 126 and/or 130. More specifically, the magnetic junction 220 may enjoy the benefits described above for the method 100. Use of the sacrificial layer and the anneal allow for improved crystallization of the free layer 228 and/or pinned layer(s) 224 and/or 232. The magnetic layers 224, 228 and/or 232 may have a high PMA and improved TMR. The sacrificial oxide layer may improve the repeatability and uniformity of these benefits. Performance of the magnetic junction 220 may thus be improved.

Figure 9:
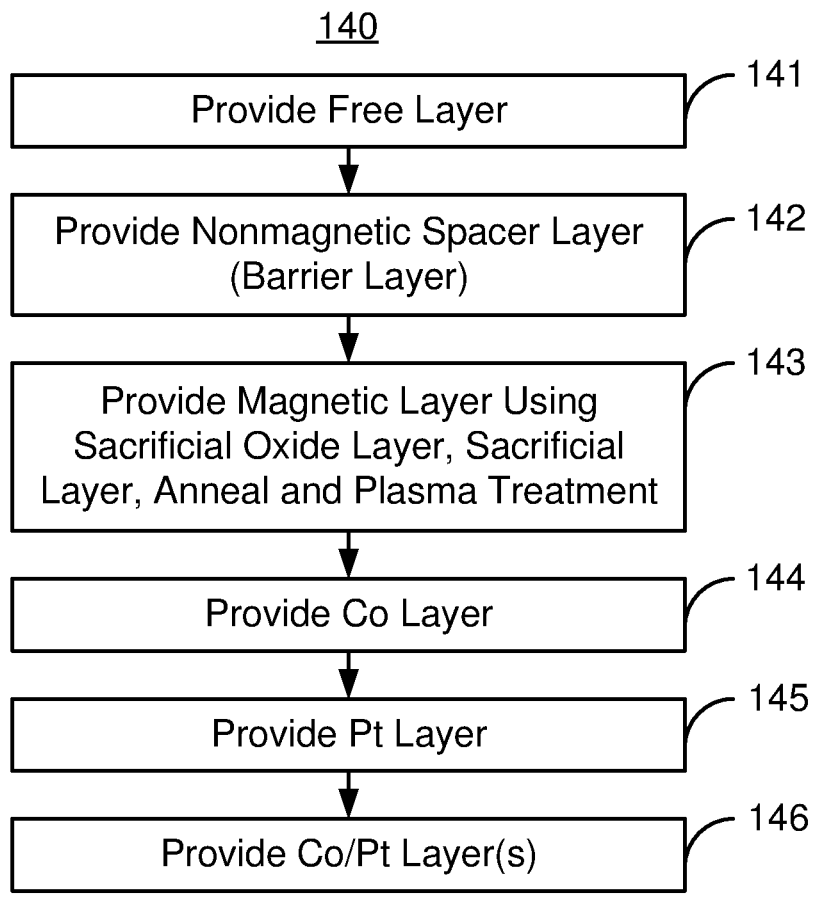
FIG. 9 is a flow chart depicting another exemplary embodiment of a method that utilizes an insertion layer for providing a magnetic junction usable in a magnetic devices such as a magnetic memory programmable using spin transfer torque and having magnetic layer(s) fabricated using sacrificial oxide and sacrificial layers.

FIG. 9 depicts an exemplary embodiment of a method 140 for fabricating a magnetic junction including a top pinned layer and usable in a magnetic device such as a STT-MRAM and, therefore, in a variety of electronic devices. For simplicity, some steps may be omitted, performed in another order, include substeps or combined. Further, the method 140 may start after other steps in forming a magnetic memory have been performed. The method 140 is described in the context of a particular magnetic junction utilizing particular materials. However, other magnetic junctions may be formed. Further, the method 140 is described as forming a single magnetic junction. However, multiple magnetic junctions may be simultaneously fabricated.

A free layer is provided, via step 141. The free layer may have a perpendicular anisotropy energy that exceeds the free layer out-of-plane demagnetization energy. Thus, the free layer may have a perpendicular-to-plane magnetic moment. In some embodiments, step 141 may utilize the method 100. Thus, the free layer may be formed by depositing a magnetic layer having a glass-promoting component, depositing a sacrificial oxide layer, depositing a sacrificial layer, annealing the layers, removing the sacrificial oxide and sacrificial layers and completing fabrication of the layer. However, in other embodiments, the free layer may be formed in another manner in step 141. The free layer may be deposited on seed layer(s) selected for various purposes including but not limited to the desired crystal structure of the free layer, magnetic anisotropy and/or magnetic damping of the free layer. Step 141 may thus provide the free layer on a seed layer such as a crystalline MgO layer.

A nonmagnetic spacer layer is provided, via step 142. In some embodiments, step 142 includes forming a crystalline MgO tunneling barrier layer Step 142 may include depositing MgO using RF sputtering. In other embodiments, metallic Mg may be deposited and then oxidized to provide a natural oxide of Mg. The MgO barrier layer/nonmagnetic spacer layer may also be formed in another manner. Step 142 may include annealing the portion of the magnetic junction already formed to provide crystalline MgO tunneling barrier with a (100) orientation for enhanced TMR of the magnetic junction.

Steps 143 through 146 are used to provide a top pinned layer. A magnetic layer, such as the layer 202' is formed using the method 100, via step 143. Thus, step 143 may include depositing a magnetic layer having a glass-promoting component, depositing a sacrificial oxide layer, depositing a sacrificial layer, annealing the layers and removing the sacrificial oxide and sacrificial layers. Completion of fabrication of the pinned layer is accomplished using steps 144-146. Steps 144-146 may be used to provide a B-PMA layer. Thus, in step 144 a Co layer is provided on the magnetic layer formed in step 143. In some embodiments, the Co layer is at least three Angstroms and not more than six Angstroms thick. A thicker Pt layer is formed on the Co layer, via step 145. For example, in some embodiments, the Pt layer is at least seven Angstroms and not more than ten Angstroms thick. A Co/Pt multilayer is provided on the Pt layer, via step 146. For example, one or more repeats of a Co/Pt bilayer may be provided. The first Co layer adjoins the Pt layer provided in step 145. In some embodiments, each Co layer in the bilayer is at least two and not more than four Angstroms thick. Each Pt layer may be at least four and not more than six Angstroms thick. In addition, a Co layer is provided on the last Pt layer of the bilayer. In some embodiments, this last Co layer is at three Angstroms and not more than five Angstroms thick. However, other thicknesses, other materials, and/or other configurations are possible.

Fabrication of the magnetic junction may then be completed. For example, a capping layer, contacts, and/or other structures may be fabricated. The edges of the magnetic junction may be defined if this has not previously been accomplished.

Figure 10:
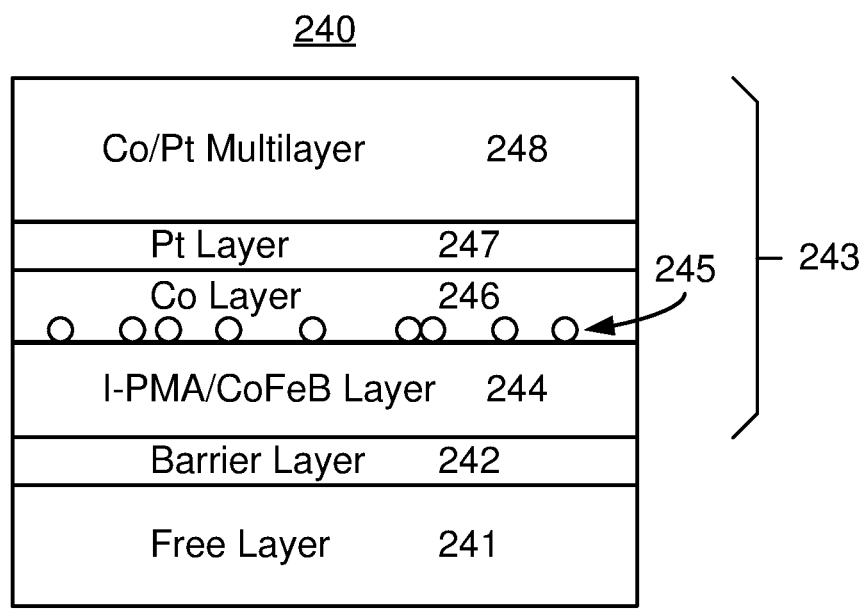
FIG. 10 depicts another exemplary embodiment of a magnetic junction usable in a magnetic devices such as a magnetic memory programmable using spin transfer torque and having magnetic layer(s) fabricated using sacrificial oxide and sacrificial layers.

FIG. 10 depicts an exemplary embodiment of a magnetic junction 240 that may be fabricated using the method 140. For clarity, FIG. 10 is not to scale. The magnetic junction 240 may be used in a magnetic device such as a STT-MRAM and, therefore, in a variety of electronic devices. For simplicity, any seed and capping layer(s) are not shown. Similarly, polarization enhancement and other layers may be present but are not shown for simplicity. The magnetic junction 240 includes a free layer 241, a nonmagnetic spacer layer 242 that may be a barrier layer and a top pinned layer 243. A bottom contact and a top contact are not shown but may be formed. The magnetic junction 240 is also configured to allow the free layer 241 to be switched between stable magnetic states when a write current is passed through the magnetic junction 240. Thus, the free layer 241 is switchable utilizing spin transfer torque when a write current is driven through the magnetic junction 240 in a CPP direction. The data stored in the magnetic junction 240, and thus the direction of magnetization of the free layer 241, may be read by driving a read current through the magnetic junction 240. The read current may also be driven through the magnetic junction 240 in the CPP direction. Thus, the magnetoresistance of the magnetic junction 240 provides the read signal.

In the embodiment shown in FIG. 10, the pinned layer 243 is formed using the method 100. Thus, the pinned layer includes a magnetic layer 244 that may be an I-PMA layer and is crystallized using an anneal in the presence of sacrificial and sacrificial oxide layers. For example, the magnetic layer 244 may be a CoFeB or FeB layer. Such a layer may be B poor due to the anneal. Also shown are Co layer 246, Pt layer 247 and Co/Pt multilayer 248 formed in steps 144, 145 and 146, respectively. In the embodiment shown, the pinned layer 243 also includes residue 245 of the sacrificial oxide and/or sacrificial layer. Thus, the residue 245 may include Mg, MgO, Ta and/or W in some embodiments. In other embodiments, the sacrificial and sacrificial oxide layers are completely removed. Thus, in other embodiments, no residue 245 remains.

The magnetic junction 240 may have improved performance due to fabrication using the method 100 in the step(s) 143, 144, 145 and 146. More specifically, the magnetic junction 240 may enjoy the benefits described above for the method 100. Use of the sacrificial layer and the anneal allow for improved crystallization of the layer 244 of the pinned layer 243. Further, the magnetic layers 244 may have a high PMA and improved TMR. The sacrificial oxide layer may improve the repeatability and uniformity of these benefits. Performance of the magnetic junction 240 may thus be improved.

Figure 11:
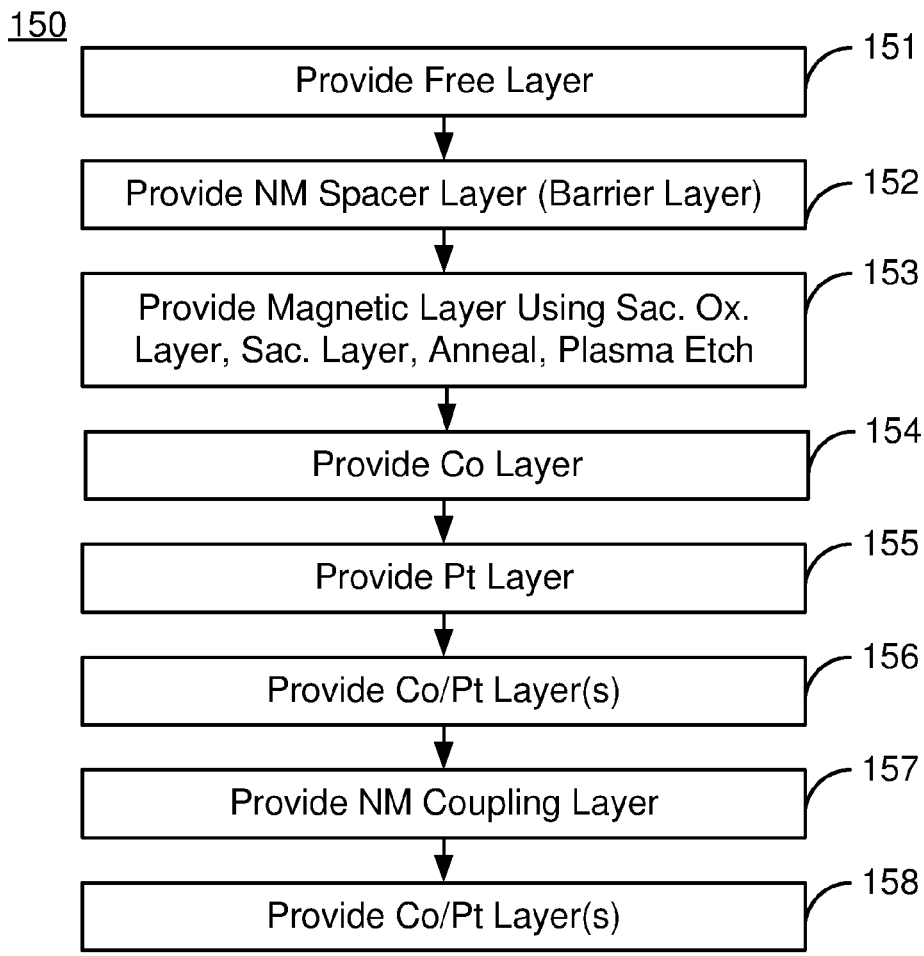
FIG. 11 is a flow chart depicting another exemplary embodiment of a method that utilizes an insertion layer for providing a magnetic junction usable in a magnetic devices such as a magnetic memory programmable using spin transfer torque and having magnetic layer(s) fabricated using sacrificial oxide and sacrificial layers.

FIG. 11 depicts an exemplary embodiment of a method 150 for fabricating a magnetic junction including a top pinned layer and usable in a magnetic device such as a STT-MRAM and, therefore, in a variety of electronic devices. For simplicity, some steps may be omitted, performed in another order, include substeps or combined. Further, the method 150 may start after other steps in forming a magnetic memory have been performed. The method 150 is described in the context of a particular magnetic junction utilizing particular materials. However, other magnetic junctions may be formed. Further, the method 150 is described as forming a single magnetic junction. However, multiple magnetic junctions may be simultaneously fabricated.

A free layer is provided, via step 151. Step 151 is analogous to step 141 of the method 140. A nonmagnetic spacer layer is provided, via step 152. Step 152 is analogous to step 142 of the method 140.

Steps 153 through 158 are used to provide a top pinned layer. A magnetic layer, such as the layer 202' is formed using the method 100, via step 153. Thus, step 153 may include depositing a magnetic layer having a glass-promoting component, depositing a sacrificial oxide layer, depositing a sacrificial layer, annealing the layers and removing the sacrificial oxide and sacrificial layers. Steps 154-158 are used to complete fabrication of the pinned layer. Steps 154-156 may be used to provide a B-PMA layer. Thus, the layers provided in steps 154-156 form the first layer of a SAF. Steps 157-158 provide additional layers such that the top pinned layer is a SAF. Steps 154, 155 and 156 may be analogous to steps 144, 145 and 146, respectively, of the method 140. Thus, a Co layer, a Pt layer and a Co/Pt multilayer are provided in steps 154, 155 and 156, respectively. The thicknesses and configurations of these layer are analogous to those described above for the method 140.

A nonmagnetic coupling layer, such as a Ru layer, is provided, via step 157. The nonmagnetic coupling layer has a thickness such that the ferromagnetic layer provided in steps 153-156 and the layer provided in step 158, below, are magnetically coupled as desired. Generally, these layers are desired to be antiferromagnetically coupled. In other embodiments, the thickness of the coupling layer may be selected to provide ferromagnetic coupling.

A top magnetic layer is provided, via step 158. In some embodiments, this layer is also a B-PMA layer. For example, a Co/Pt multilayer may be formed in step 158. Thus, a Co layer may be formed adjoining the nonmagnetic coupling layer. This Co layer may be at least three Angstroms and not more than six Angstroms thick. A Pt/Co bilayer having a number of repeats may be formed on the Co layer. The thicknesses of the Pt and Co layers may vary between the repeats. For example, the first Pt layer may have a thickness of at least three and not more than five Angstroms. The first Co layer may have a thickness of at least one and not more than three Angstroms. Subsequent repeats of the Pt layer may have a thickness of at least one and not more than three Angstroms. The Co layer may have approximately the same thickness in subsequent repeats. Other thicknesses are possible. Fabrication of the magnetic junction may then be completed. For example, a capping layer, contacts, and/or other structures may be fabricated. The edges of the magnetic junction may be defined if this has not previously been accomplished.

Figure 12:
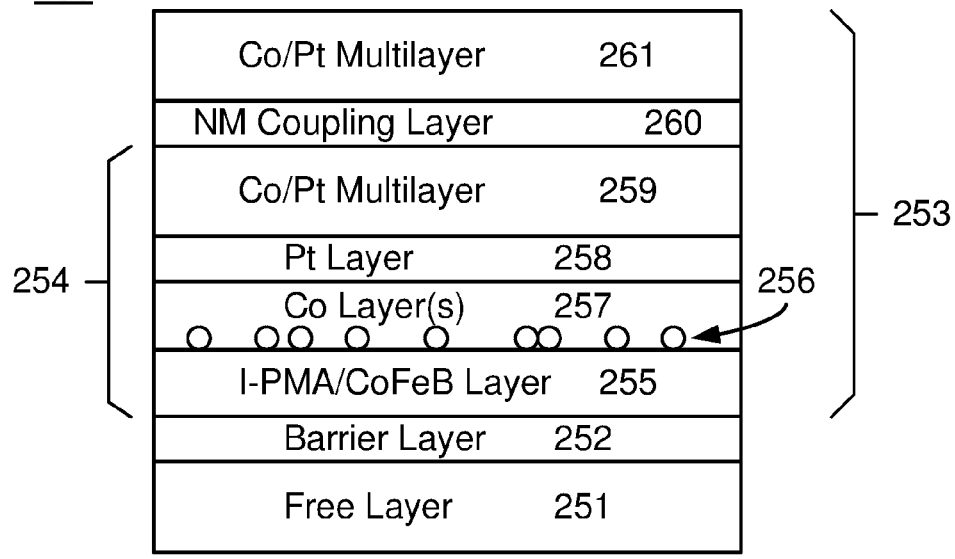
FIG. 12 depicts another exemplary embodiment of a magnetic junction usable in a magnetic devices such as a magnetic memory programmable using spin transfer torque and having magnetic layer(s) fabricated using sacrificial oxide and sacrificial layers.

FIG. 12 depicts an exemplary embodiment of a magnetic junction 250 that may be fabricated using the method 150. For clarity, FIG. 12 is not to scale. The magnetic junction 250 may be used in a magnetic device such as a STT-MRAM and, therefore, in a variety of electronic devices. For simplicity, any seed and capping layer(s) are not shown. Similarly, polarization enhancement and other layers may be present but are not shown for simplicity. The magnetic junction 250 includes a free layer 251, a nonmagnetic spacer layer 252 that may be a barrier layer and a top pinned layer 253. A bottom contact and a top contact are not shown but may be formed. The magnetic junction 250 is also configured to allow the free layer 251 to be switched between stable magnetic states when a write current is passed through the magnetic junction 250. Thus, the free layer 251 is switchable utilizing spin transfer torque when a write current is driven through the magnetic junction 50 in a CPP direction. The data stored in the magnetic junction 250, and thus the direction of magnetization of the free layer 251, may be read by driving a read current through the magnetic junction 250. The read current may also be driven through the magnetic junction 50 in the CPP direction. Thus, the magnetoresistance of the magnetic junction 250 provides the read signal.

In the embodiment shown in FIG. 12, the pinned layer 253 is formed using the method 100. The magnetic layer 254 is analogous to the pinned layer 243 depicted in FIG. 10. Thus, the pinned layer includes a magnetic layer 255 that may be an I-PMA layer and is crystallized using an anneal in the presence of sacrificial and sacrificial oxide layers. For example, the magnetic layer 255 may be a CoFeB or FeB layer. Such a layer may be B poor due to the anneal. Also shown are Co layer 257, Pt layer 258 and Co/Pt multilayer 259 formed in steps 154, 155 and 156, respectively. In the embodiment shown, the magnetic layer 254 also includes residue 256 of the sacrificial oxide and/or sacrificial layer. Thus, the residue 256 may include Mg, MgO, Ta and/or W in some embodiments. In other embodiments, the sacrificial and sacrificial oxide layers are completely removed. Thus, in other embodiments, no residue 256 remains.

The pinned layer 253 is also a SAF. Thus, magnetic layers 254 and 261 separated by nonmagnetic coupling layer 260 are part of the pinned layer 253. Although described as being a B-PMA layer, in other embodiments, the layer 261 may be analogous to the layer 254 and formed using the method 100.

The magnetic junction 250 may have improved performance due to fabrication using the method 100 in the step(s) 153, 154, 155 and 156. More specifically, the magnetic junction 250 may enjoy the benefits described above for the method 100. Use of the sacrificial layer and the anneal allow for improved crystallization of the layer 255 of the magnetic layer 254. Further, the magnetic layers 254 and 261 may have a high PMA and improved TMR. The sacrificial oxide layer may improve the repeatability and uniformity of these benefits. Performance of the magnetic junction 250 may thus be improved.

Figure 13:
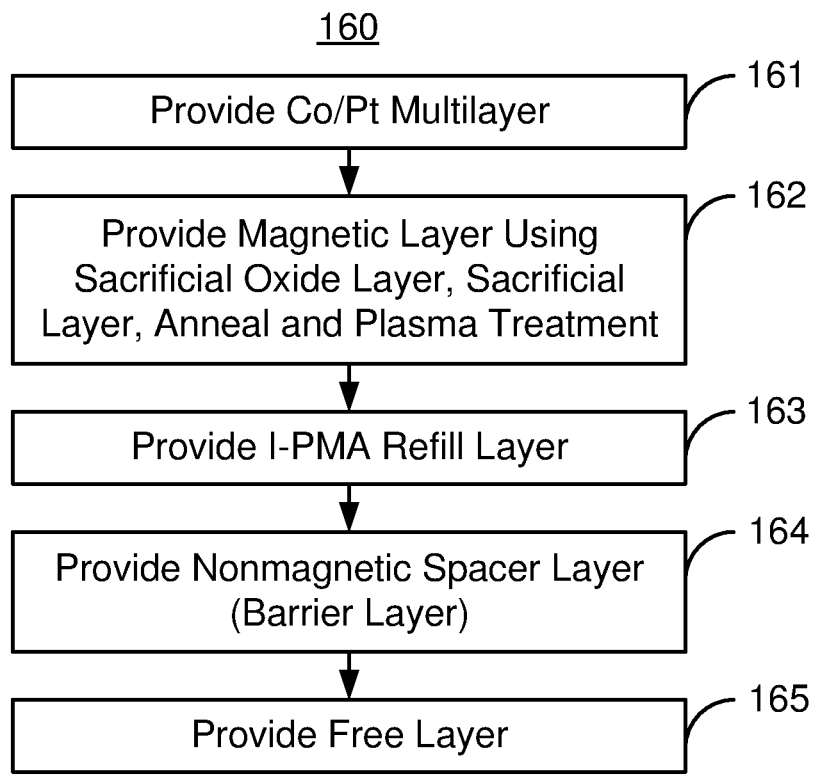
FIG. 13 is a flow chart depicting another exemplary embodiment of a method that utilizes an insertion layer for providing a magnetic junction usable in a magnetic devices such as a magnetic memory programmable using spin transfer torque and having magnetic layer(s) fabricated using sacrificial oxide and sacrificial layers.

FIG. 13 depicts an exemplary embodiment of a method 160 for fabricating a magnetic junction including a bottom pinned layer and usable in a magnetic device such as a STT-MRAM and, therefore, in a variety of electronic devices. For simplicity, some steps may be omitted, performed in another order, include substeps or combined. Further, the method 160 may start after other steps in forming a magnetic memory have been performed. The method 160 is described in the context of a particular magnetic junction utilizing particular materials. However, other magnetic junctions may be formed. Further, the method 160 is described as forming a single magnetic junction. However, multiple magnetic junctions may be simultaneously fabricated.

Steps 161 through 166 are used to provide a bottom pinned layer. A B-PMA layer may be provided, via step 161. Step 161 may thus be analogous to steps 144-146, 154-156 and 112 of the methods 140, 150 and 100, respectively. For example, a Co/Pt multilayer analogous to that described above may be formed in step 161. A magnetic layer, such as the layer 202' is formed using the method 100, via step 162. Thus, step 162 may include depositing a magnetic layer having a glass-promoting component, depositing a sacrificial oxide layer, depositing a sacrificial layer, annealing the layers and removing the sacrificial oxide and sacrificial layers. Completion of fabrication of the bottom pinned layer is accomplished using step 163. In the embodiment shown, step 163 may be used to complete an I-PMA layer. Thus, step 163 may include depositing an additional CoFeB, FeB or analogous layer. In general, the magnetic layer deposited in step 162 may be desired to be thicker than the I-PMA layer deposited in step 163. For example, an I-PMA layer deposited in step 162 may be at least fifteen and not more than twenty Angstroms thick. The layer deposited in step 163 may be at least five and not more than ten Angstroms thick. Using steps 161 and 162, a pinned layer having a B-PMA layer and an I-PMA layer may be formed.

A nonmagnetic spacer layer is provided, via step 164. Step 164 is analogous to steps 142 and 152 of the methods 140 and 150, respectively. A free layer is provided, via step 165. Step 165 is analogous to steps 141 and 151 of the methods 140 and 150, respectively. However, in this embodiment, the free layer is provided on the nonmagnetic spacer layer rather than on an underlying seed layer.

Figure 14:
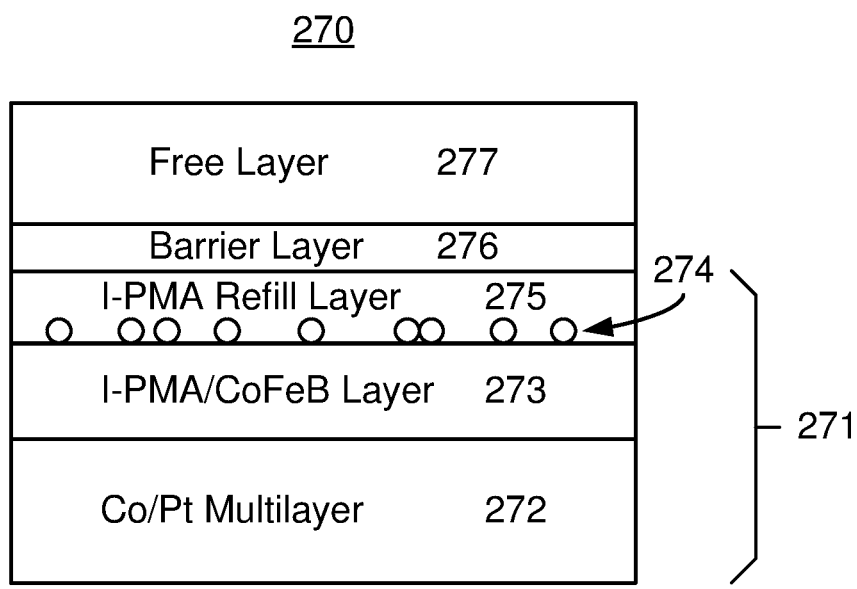
FIG. 14 depicts another exemplary embodiment of a magnetic junction usable in a magnetic devices such as a magnetic memory programmable using spin transfer torque and having magnetic layer(s) fabricated using sacrificial oxide and sacrificial layers.

FIG. 14 depicts an exemplary embodiment of a magnetic junction 270 that may be fabricated using the method 160.

For clarity, FIG. 14 is not to scale. The magnetic junction 270 may be used in a magnetic device such as a STT-MRAM and, therefore, in a variety of electronic devices. For simplicity, any seed and capping layer(s) are not shown. Similarly, polarization enhancement and other layers may be present but are not shown for simplicity. The magnetic junction 270 includes a bottom pinned layer 271, a nonmagnetic spacer layer 276 that may be a barrier layer and a free layer 277. A bottom contact and a top contact are not shown but may be formed. The magnetic junction 270 is also configured to allow the free layer 277 to be switched between stable magnetic states when a write current is passed through the magnetic junction 270. Thus, the free layer 277 is switchable utilizing spin transfer torque when a write current is driven through the magnetic junction 270 in a CPP direction. The data stored in the magnetic junction 270, and thus the direction of magnetization of the free layer 277, may be read by driving a read current through the magnetic junction 270. The read current may also be driven through the magnetic junction 270 in the CPP direction. Thus, the magnetoresistance of the magnetic junction 270 provides the read signal.

In the embodiment shown in FIG. 14, the pinned layer 271 is formed using the method 100. Thus, the pinned layer 271 includes a magnetic layer 273 that may be an I-PMA layer and is crystallized using an anneal in the presence of sacrificial and sacrificial oxide layers. For example, the magnetic layer 273 may be a CoFeB or FeB layer. Such a layer may be B poor due to the anneal. Also shown are a Co/Pt multilayer 272 and an I-PMA refill layer 275 formed in steps 161 and 163, respectively. In the embodiment shown, the pinned layer 271 also includes residue 274 of the sacrificial oxide and/or sacrificial layer. Thus, the residue 274 may include Mg, MgO, Ta and/or W in some embodiments. In other embodiments, the sacrificial and sacrificial oxide layers are completely removed. Thus, in other embodiments, no residue 274 remains.

The magnetic junction 270 may have improved performance due to fabrication using the method 100 in the step(s) 162 and 163. More specifically, the magnetic junction 270 may enjoy the benefits described above for the method 100. Use of the sacrificial layer and the anneal allow for improved crystallization of the layer 273 of the pinned layer 271. Further, the magnetic layers 272, 273 and 274 may have a high PMA and improved TMR. The sacrificial oxide layer may improve the repeatability and uniformity of these benefits. Performance of the magnetic junction 270 may thus be improved.

Figure 15:
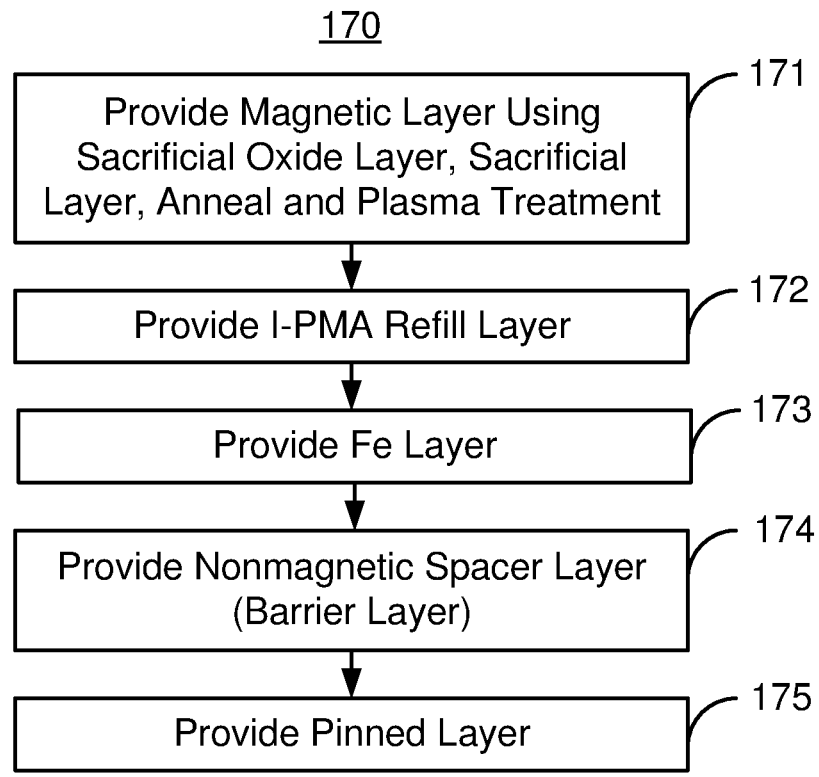
FIG. 15 is a flow chart depicting another exemplary embodiment of a method that utilizes an insertion layer for providing a magnetic junction usable in a magnetic devices such as a magnetic memory programmable using spin transfer torque and having magnetic layer(s) fabricated using sacrificial oxide and sacrificial layers.

FIG. 15 depicts an exemplary embodiment of a method 170 for fabricating a magnetic junction including a top pinned layer and usable in a magnetic device such as a STT-MRAM and, therefore, in a variety of electronic devices. For simplicity, some steps may be omitted, performed in another order, include substeps or combined. Further, the method 170 may start after other steps in forming a magnetic memory have been performed. The method 170 is described in the context of a particular magnetic junction utilizing particular materials. However, other magnetic junctions may be formed. Further, the method 170 is described as forming a single magnetic junction. However, multiple magnetic junctions may be simultaneously fabricated.

Steps 171 through 173 are used to provide a bottom free layer. A magnetic layer, such as the layer 202' is formed using the method 100, via step 171. Thus, step 171 may include depositing a magnetic layer having a glass-promoting component, depositing a sacrificial oxide layer, depositing a sacrificial layer, annealing the layers and removing the sacrificial oxide and sacrificial layers. Steps 172 and 173 are used to complete fabrication of the free layer. In the embodiment shown, step 172 may be used to complete an I-PMA layer. Thus, step 172 may include depositing an additional CoFeB, FeB or analogous layer. In general, the magnetic layer deposited in step 171 may be desired to be thicker than the I-PMA refill layer deposited in step 172. For example, an I-PMA layer deposited in step 171 may be at least fifteen and not more than twenty Angstroms thick. The layer deposited in step 172 may be at least five and not more than ten Angstroms thick. A high spin polarization layer may be provided, via step 173. For example, step 173 may include depositing an Fe layer. Using steps 171, 172 and 173, a free layer including an I-PMA layer, and an attendant high PMA, may be formed.

A nonmagnetic spacer layer is provided, via step 174. Step 174 is analogous to steps 142, 152 and 164 of the methods 140, 150 and 160, respectively. A pinned layer is provided, via step 175. Step 175 may be analogous to steps 143-146, 153-158 or steps 161-163 of the methods 140, 150 and 160, respectively. However, in other embodiments, the pinned layer may be formed in another manner.

Figure 16:
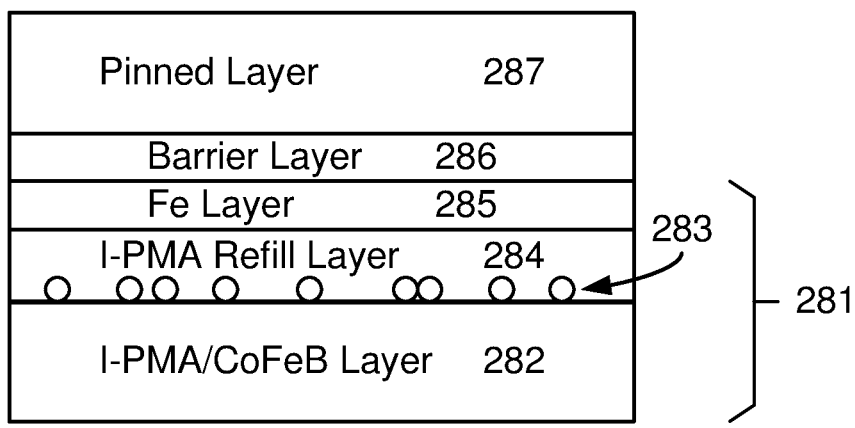
FIG. 16 depicts another exemplary embodiment of a magnetic junction usable in a magnetic devices such as a magnetic memory programmable using spin transfer torque and having magnetic layer(s) fabricated using sacrificial oxide and sacrificial layers.

FIG. 16 depicts an exemplary embodiment of a magnetic junction 280 that may be fabricated using the method 170. For clarity, FIG. 16 is not to scale. The magnetic junction 280 may be used in a magnetic device such as a STT-MRAM and, therefore, in a variety of electronic devices. For simplicity, any seed and capping layer(s) are not shown. Similarly, polarization enhancement and other layers may be present but are not shown for simplicity. The magnetic junction 280 includes a bottom free layer 281, a nonmagnetic spacer layer 286 that may be a barrier layer and a top pinned layer 287. A bottom contact and a top contact are not shown but may be formed. Optional pinning layer(s) (not shown) may be used to fix the magnetization of the pinned layer 287. In some embodiments, the optional pinning layer may be an AFM layer or multilayer that pins the magnetization(s) through an exchange-bias interaction. However, in other embodiments, the optional pinning layer may be omitted or another structure may be used. The magnetic junction 280 is also configured to allow the free layer 281 to be switched between stable magnetic states when a write current is passed through the magnetic junction 280. Thus, the free layer 281 is switchable utilizing spin transfer torque when a write current is driven through the magnetic junction 280 in a CPP direction. The data stored in the magnetic junction 280, and thus the direction of magnetization of the free 281, may be read by driving a read current through the magnetic junction 280. The read current may also be driven through the magnetic junction 280 in the CPP direction. Thus, the magnetoresistance of the magnetic junction 280 provides the read signal.

In the embodiment shown in FIG. 16, the free layer 281 is formed using the method 100. Thus, the free layer 281 includes a magnetic layer 282 that may be an I-PMA layer and is crystallized using an anneal in the presence of sacrificial and sacrificial oxide layers. For example, the magnetic layer 282 may be a CoFeB or FeB layer. Such a layer may be B poor due to the anneal. Also shown is an I-PMA refill layer 284 and an Fe layer formed in steps 172 and 173, respectively. In the embodiment shown, the free layer 281 also includes residue 283 of the sacrificial oxide and/or sacrificial layer. Thus, the residue 283 may include Mg, MgO, Ta and/or W in some embodiments. In other embodiments, the sacrificial and sacrificial oxide layers are completely removed. Thus, in other embodiments, no residue 283 remains.

The magnetic junction 280 may have improved performance due to fabrication using the method 100 in the step(s) 172 and 173. More specifically, the magnetic junction 280 may enjoy the benefits described above for the method 100. Use of the sacrificial layer and the anneal allow for improved crystallization of the layer 823 of the free layer 281. Further, the magnetic layers 282, 284 and 285 may have a high PMA and improved TMR. The sacrificial oxide layer may improve the repeatability and uniformity of these benefits. Performance of the magnetic junction 280 may thus be improved.

Figure 17:
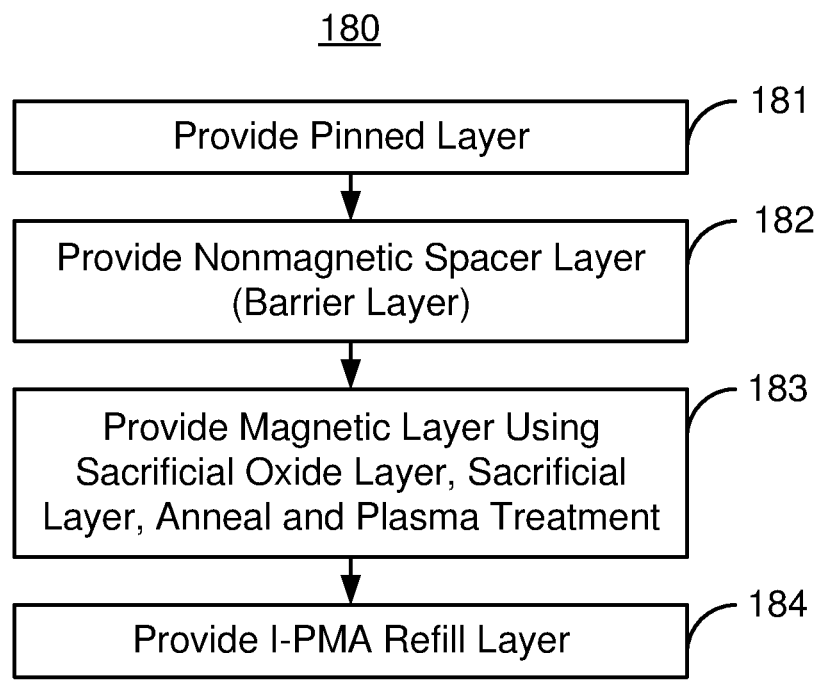
FIG. 17 is a flow chart depicting another exemplary embodiment of a method that utilizes an insertion layer for providing a magnetic junction usable in a magnetic devices such as a magnetic memory programmable using spin transfer torque and having magnetic layer(s) fabricated using sacrificial oxide and sacrificial layers.

FIG. 17 depicts an exemplary embodiment of a method 180 for fabricating a magnetic junction including a bottom pinned layer and usable in a magnetic device such as a STT-MRAM and, therefore, in a variety of electronic devices. For simplicity, some steps may be omitted, performed in another order, include substeps or combined. Further, the method 180 may start after other steps in forming a magnetic memory have been performed. The method 180 is described in the context of a particular magnetic junction utilizing particular materials. However, other magnetic junctions may be formed. Further, the method 180 is described as forming a single magnetic junction. However, multiple magnetic junctions may be simultaneously fabricated.

A bottom pinned layer is provided, via step 181. Step 181 may be analogous to steps 143-146, 153-158 or steps 161-163 of the methods 140, 150 and 160, respectively. However, in other embodiments, the pinned layer may be formed in another manner. A nonmagnetic spacer layer is provided, via step 182. Step 182 is analogous to steps 142, 152, 164 and 174 of the methods 140, 150, 160 and 170, respectively.

Steps 183 through 184 are used to provide a top free layer. A magnetic layer, such as the layer 202' is formed using the method 100, via step 183. Thus, step 183 may include depositing a magnetic layer having a glass-promoting component, depositing a sacrificial oxide layer, depositing a sacrificial layer, annealing the layers and removing the sacrificial oxide and sacrificial layers. Completion of fabrication is accomplished using step 184. In the embodiment shown, step 184 may be used to complete an I-PMA layer. Thus, step 184 may include depositing an additional CoFeB, FeB or analogous layer. In general, the magnetic layer deposited in step 183 may be desired to be thicker than the I-PMA refill layer deposited in step 184. For example, an I-PMA layer deposited in step 183 may be at least fifteen and not more than twenty Angstroms thick. The layer deposited in step 184 may be at least five and not more than ten Angstroms thick. Using steps 183 and 184, a free layer having a high PMA, may be formed.

Figure 18:
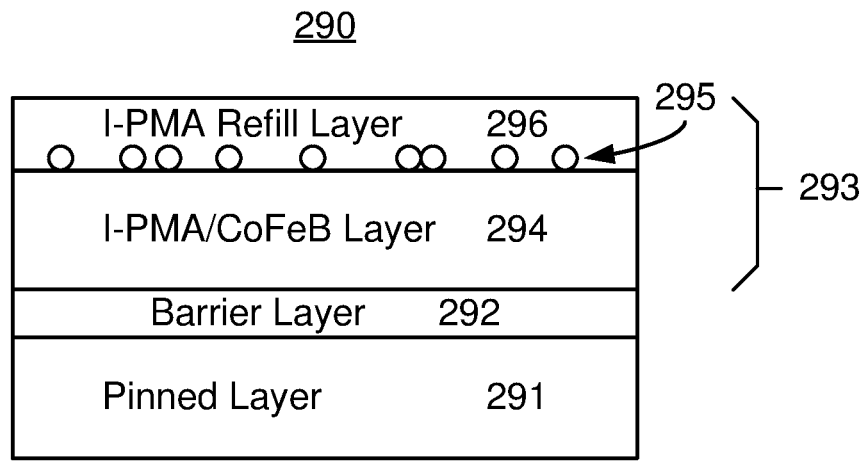
FIG. 18 depicts another exemplary embodiment of a magnetic junction usable in a magnetic devices such as a magnetic memory programmable using spin transfer torque and having magnetic layer(s) fabricated using sacrificial oxide and sacrificial layers.

FIG. 18 depicts an exemplary embodiment of a magnetic junction 290 that may be fabricated using the method 180. For clarity, FIG. 18 is not to scale. The magnetic junction 290 may be used in a magnetic device such as a STT-MRAM and, therefore, in a variety of electronic devices. For simplicity, any seed and capping layer(s) are not shown. Similarly, polarization enhancement and other layers may be present but are not shown for simplicity. The magnetic junction 290 includes a bottom pinned layer 291, a nonmagnetic spacer layer 292 that may be a barrier layer and a top free layer 293. A bottom contact and a top contact are not shown but may be formed. Optional pinning layer(s) (not shown) may be used to fix the magnetization of the pinned layer 291. In some embodiments, the optional pinning layer may be an AFM layer or multilayer that pins the magnetization(s) through an exchange-bias interaction. However, in other embodiments, the optional pinning layer may be omitted or another structure may be used. The magnetic junction 290 is also configured to allow the free layer 293 to be switched between stable magnetic states when a write current is passed through the magnetic junction 290. Thus, the free layer 293 is switchable utilizing spin transfer torque when a write current is driven through the magnetic junction 290 in a CPP direction. The data stored in the magnetic junction 290, and thus the direction of magnetization of the free 293, may be read by driving a read current through the magnetic junction 290. The read current may also be driven through the magnetic junction 290 in the CPP direction. Thus, the magnetoresistance of the magnetic junction 290 provides the read signal.

In the embodiment shown in FIG. 16, the free layer 293 is formed using the method 100. Thus, the free layer 293 includes a magnetic layer 294 that may be an I-PMA layer and is crystallized using an anneal in the presence of sacrificial and sacrificial oxide layers. For example, the magnetic layer 294 may be a CoFeB or FeB layer. Such a layer may be B poor due to the anneal. Also shown is an I-PMA refill layer 296 formed in step 184. In the embodiment shown, the free layer 293 also includes residue 295 of the sacrificial oxide and/or sacrificial layer. Thus, the residue 295 may include Mg, MgO, Ta and/or W in some embodiments. In other embodiments, the sacrificial and sacrificial oxide layers are completely removed. Thus, in other embodiments, no residue 295 remains.

The magnetic junction 290 may have improved performance due to fabrication using the method 100 in the step(s) 183 and 184. More specifically, the magnetic junction 290 may enjoy the benefits described above for the method 100. Use of the sacrificial layer and the anneal allow for improved crystallization of the layer 294 of the free layer 293. Further, the magnetic layers 294 and 295 may have a high PMA and improved TMR. The sacrificial oxide layer may improve the repeatability and uniformity of these benefits. Performance of the magnetic junction 290 may thus be improved.

Although the method and apparatus have been described in the context of specific features, steps and components, one of ordinary skill in the art will recognize that one or more of these features, steps and/or components may be combined in other manners not inconsistent with the description herein.

Figure 19:
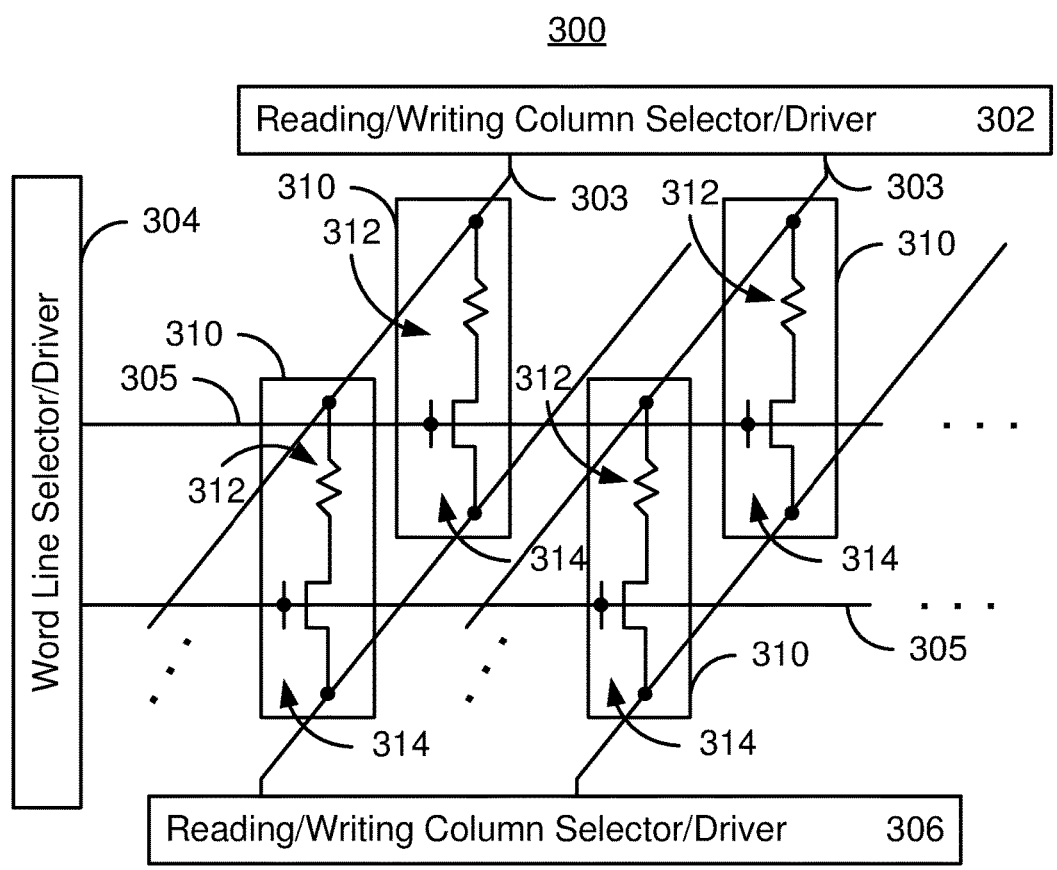
FIG. 19 depicts an exemplary embodiment of a memory utilizing magnetic junctions in the memory element(s) of the storage cell(s).

FIG. 19 depicts an exemplary embodiment of a memory 300 that may use one or more of the magnetic junctions 220, 240, 250, 270, 280, 290 and/or other magnetic junction including layer 200. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 220, 240, 250, 270, 280, 290 and/or other magnetic junction including layer 200 disclosed herein. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing magnetic junction residing on a substrate and usable in a magnetic device, the method comprising:
providing a pinned layer, the pinned layer being magnetic;
providing a nonmagnetic spacer layer; and
providing a free layer, the nonmagnetic spacer layer being between the pinned layer and the free layer, the free layer being magnetic and switchable between a plurality of stable magnetic states when a write current is passed through the magnetic junction, wherein at least one of the providing the pinned layer and the providing the free layer further include
providing a magnetic layer including a glass-promoting component, the magnetic layer being amorphous as-deposited;
providing a sacrificial oxide layer on the magnetic layer;
providing a sacrificial layer on the sacrificial oxide layer, the sacrificial layer including a sink for the glass-promoting component;
performing at least one anneal of the magnetic layer, the sacrificial oxide layer and the sacrificial layer at an anneal temperature greater than 300 degrees Celsius and not more than 475 degrees Celsius, the magnetic layer being at least partially crystallized after the at least one anneal; and
removing the sacrificial layer and the sacrificial oxide layer after the performing the at least one anneal.

2. The method of claim 1 wherein the pinned layer has a pinned layer perpendicular magnetic anisotropy energy greater than a pinned layer out-of-plane demagnetization energy and the free layer has a free layer perpendicular magnetic anisotropy greater than a free layer out-of-plane demagnetization energy.

3. The method of claim 1 wherein the anneal temperature is at least three hundred fifty degrees Celsius and not more than four hundred degrees Celsius.

4. The method of claim 1 wherein the glass-promoting component includes B.

5. The method of claim 4 wherein the sacrificial layer includes at least one of Ta, Hf, Rb, Sc, Zr, Nb, Mg, V, Mn, Ag, Be, Mo, Ti, Cr, Al, Te and W.

6. The method of claim 1 wherein the magnetic layer is selected from a CoFeB layer and a FeB layer.

7. The method of claim 1 wherein the step of providing the free layer is performed before the providing the pinned layer and wherein the providing the pinned layer includes the providing the magnetic layer, providing the sacrificial oxide layer, providing the sacrificial layer, performing at least one anneal and removing the sacrificial layer and the sacrificial oxide layer and wherein the providing the pinned layer further includes:
providing at least one bulk-perpendicular magnetic anisotropy (B-PMA) layer after the removing the sacrificial layer and the sacrificial oxide layer.

8. The method of claim 7 wherein the step of providing at least one B-PMA layer further includes:
providing a Co layer after the removing the sacrificial layer and the sacrificial oxide layer;
providing a Pt layer on the Co layer; and
providing a Co/Pt multilayer on the Pt layer such that a Co sublayer of the Co/Pt multilayer adjoins the Pt layer.

9. The method of claim 7 wherein the step of providing the pinned layer further includes:
providing a nonmagnetic coupling on layer the B-PMA layer; and
providing an additional magnetic layer on the nonmagnetic coupling layer.

10. The method of claim 1 wherein the providing the free layer is performed after the providing the pinned layer and wherein the providing the pinned layer includes depositing the magnetic layer, providing the sacrificial oxide layer, providing the sacrificial layer, performing at least one anneal and removing the sacrificial layer and the sacrificial oxide layer and wherein the providing the pinned layer further includes:
providing at least one bulk perpendicular magnetic anisotropy (B-PMA) layer, the magnetic layer being provided on the at least one B-PMA layer.

11. The method of claim 10 wherein the providing the at least one additional magnetic layer further includes:
providing a Co/Pt multilayer, the magnetic layer being provided on the Co/Pt multilayer.

12. The method of claim 1 wherein the providing the free layer is performed before the providing the pinned layer and wherein the providing the free layer includes the providing the magnetic layer, providing the sacrificial oxide layer, providing the sacrificial layer, performing at least one anneal and removing the sacrificial layer and the sacrificial oxide layer and wherein the providing the free layer further includes:
providing an additional magnetic layer including an additional glass-promoting component after the step of removing the sacrificial layer and the sacrificial oxide layer, the additional magnetic layer being amorphous as-deposited.

13. The method of claim 12 wherein the additional magnetic layer is selected from a CoFeB layer and an FeB layer.

14. The method of claim 1 wherein the providing the free layer is performed after the providing the pinned layer and wherein the providing the free layer includes the depositing the magnetic layer, providing the sacrificial oxide layer, providing the sacrificial layer, performing at least one anneal and removing the sacrificial layer and the sacrificial oxide layer and wherein the providing the free layer further includes:
providing an additional magnetic layer including an additional glass-promoting component after the removing the sacrificial layer and the sacrificial oxide layer, the additional magnetic layer being amorphous as-deposted.

15. The method of claim 14 wherein the additional magnetic layer is selected from a CoFeB layer and an FeB layer.

16. The method of claim 1 wherein the providing the nonmagnetic spacer layer further includes:
providing an MgO tunneling barrier layer.

17. The method of claim 1 further comprising:
providing an additional nonmagnetic spacer layer, the free layer being between the additional nonmagnetic spacer layer and the nonmagnetic spacer layer; and
providing an additional pinned layer, the additional nonmagnetic spacer layer being between the additional pinned layer and the free layer.

18. The method of claim 1 wherein the sacrificial oxide layer has a first thickness of greater than zero Angstroms and not more than five Angstroms and the sacrificial layer has a thickness of at least two Angstroms and not more than five Angstroms.

19. A method for providing magnetic junction residing on a substrate and usable in a magnetic device, the method comprising:

providing a pinned layer, the pinned layer being magnetic; providing a nonmagnetic spacer layer; and providing a free layer, the nonmagnetic spacer layer being between the pinned layer and the free layer, the free layer being magnetic and switchable between a plurality of stable magnetic states when a write current is passed through the magnetic junction, wherein at least one of the providing the pinned layer and the providing the free layer further include providing a magnetic layer including B and at least one of Co and Fe, the magnetic layer being amorphous as-deposited;

providing an MgO layer on the magnetic layer, the MgO layer having a first thickness of at least two Angstroms and not more than four Angstroms;

depositing a sacrificial layer on the MgO layer, the sacrificial layer including at least one of Ta and W, the sacrificial layer having a second thickness of at least two Angstroms and not more than five Angstroms;

performing at least one anneal of the magnetic layer, the MgO layer and the sacrificial layer at an anneal temperature greater than 350 degrees Celsius and not more than 400 degrees Celsius, the magnetic layer being at least partially crystallized after the at least one anneal; and removing the sacrificial layer and the MgO layer after the performing the at least one anneal.

* * * * *